(12) United States Patent
Kim (10) Patent No.: US 7,815,464 B2
(45) Date of Patent: Oct. 19, 2010

(54) STORAGE DEVICE HAVING A MEMORY MODULE, COVER, AND LIGHT-TRANSMISSION ELEMENTS

(75) Inventor: Hyekyung (Sophia) Kim, Lathrop, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/710,705

(22) Filed: Feb. 23, 2010

(65) Prior Publication Data

US 2010/0151713 A1 Jun. 17, 2010

Related U.S. Application Data

(63) Continuation of application No. 11/803,862, filed on May 16, 2007, now Pat. No. 7,699,630.

(51) Int. Cl.
H01R 13/62 (2006.01)
(52) U.S. Cl. .................................. 439/490; 439/367
(58) Field of Classification Search ................. 439/490, 439/488, 489, 367
See application file for complete search history.

(56) References Cited

U.S. PATENT DOCUMENTS

| D444,788 S | 7/2001 | Do et al. |
|---|---|---|
| 6,896,542 B2 * | 5/2005 | Chang .................. 439/490 |
| 7,092,256 B1 | 8/2006 | Salazar et al. |
| 7,181,053 B2 | 2/2007 | Wang et al. |
| 7,632,134 B2 * | 12/2009 | Su et al. .................. 439/490 |
| 7,699,630 B2 * | 4/2010 | Kim .................. 439/136 |
| 2003/0100218 A1 * | 5/2003 | Tsai et al. .................. 439/490 |
| 2004/0083320 A1 | 4/2004 | Yu |
| 2005/0101180 A1 * | 5/2005 | Sirichai et al. .............. 439/490 |
| 2005/0130469 A1 | 6/2005 | Ikenoue |
| 2006/0082963 A1 | 4/2006 | Chen |
| 2006/0155914 A1 | 7/2006 | Jobs et al. |
| 2007/0015407 A1 | 1/2007 | Loftus |
| 2008/0090450 A1 * | 4/2008 | Harano et al. ................ 439/490 |
| 2008/0305662 A1 * | 12/2008 | Regen et al. ................. 439/131 |
| 2009/0280677 A1 * | 11/2009 | Gingrich, III ............... 439/490 |

FOREIGN PATENT DOCUMENTS

EP 1 367 497 A2 12/2003

* cited by examiner

*Primary Examiner*—Chandrika Prasad
(74) *Attorney, Agent, or Firm*—Leffert Jay & Polglaze, P.A.

(57) ABSTRACT

A storage device has a memory module, a cover, and light-transmission elements. In one such storage device, a cover has light-transmission elements extending from opposing exterior surfaces of the cover. In a configuration of the memory module and the cover, the light-transmission elements are optically coupled to the light source.

20 Claims, 12 Drawing Sheets

STORAGE DEVICE HAVING A MEMORY MODULE, COVER, AND LIGHT-TRANSMISSION ELEMENTS

RELATED APPLICATION

This application is a continuation of U.S. application Ser. No. 11/803,862, titled "MEMORY MODULE HAVING A COVER PIVOTALLY COUPLED THERETO," filed May 16, 2007, now U.S. Pat. No. 7,699,630 (allowed) which is commonly assigned and incorporated herein by reference.

FIELD

The present disclosure relates generally to storage devices, and, in particular, the present disclosure relates to storage devices having a memory module, a cover, and light-transmission elements.

BACKGROUND

Portable memory modules, such as removable flash memory modules, e.g., USB flash drives, have gained widespread acceptance for use as portable storage media. Generally, the memory modules are removably coupled to a host device, such as a digital camera, a digital recording and playback device, a PDA, a personal computer, a memory card reader, an interface hub, or the like, for writing data to or reading data from the host device.

The memory modules typically include one or more memory devices, such as one or more NAND, NOR, AND, or NROM flash memory devices, dynamic random access memory devices (DRAMs), static random access memory devices (SRAMs), or the like, having a memory array coupled to a controller for controlling operations of the memory array. The one or more memory devices are typically disposed on a printed circuit board and are often enclosed within a housing along with the circuit board. The housing typically includes one or more contacts, e.g., in the form of a USB connector, for connecting the memory module to the host device. However, due to the portability of these memory modules, the contacts are susceptible to damage if not properly protected, and as these memory modules become smaller, they are more easily lost and are harder to handle. Therefore, covers are often used to cover the contacts when the memory modules are not in use. Moreover, some covers may act to increase the size of the memory module so that the memory module is easier to handle. However, some covers are removable from the memory module and may be easily lost.

For the reasons stated above, and for other reasons which will become apparent to those skilled in the art upon reading and understanding the present specification, there is a need in the art for alternatives to existing memory module covers.

DETAILED DESCRIPTION

In the following detailed description, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

Figure 1:
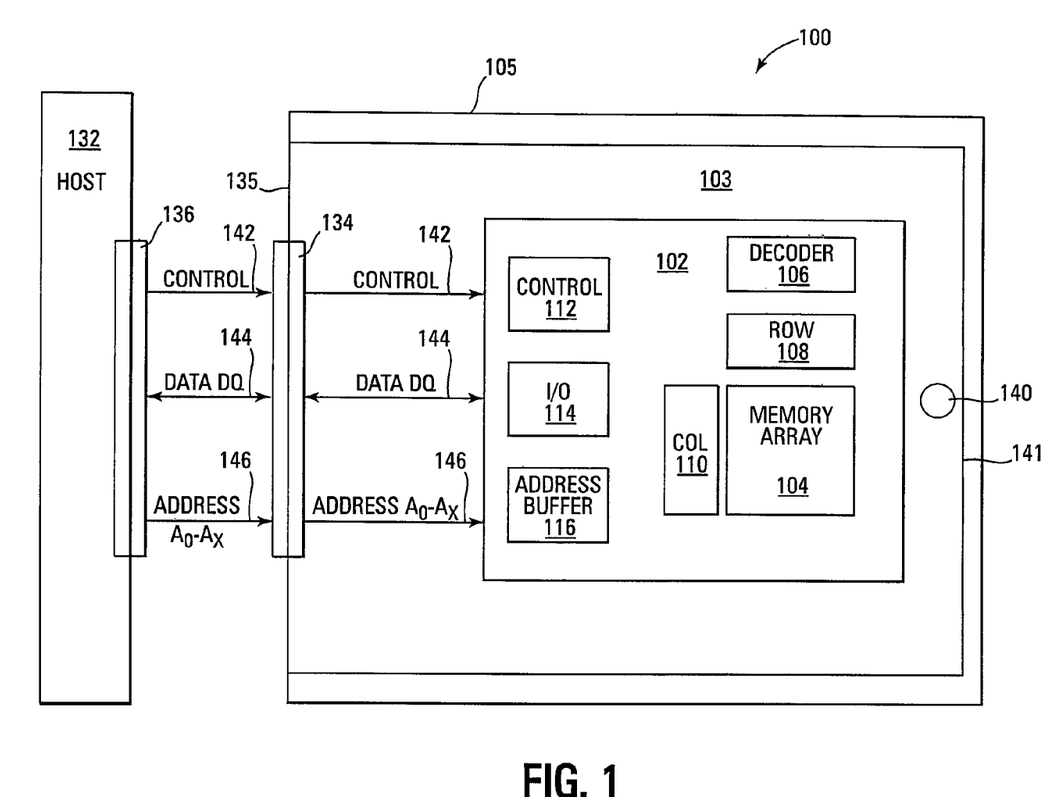
FIG. 1 is a block diagram illustration of an embodiment of a memory module, according to an embodiment of the disclosure.

FIG. 1 is a block diagram illustration of a portable memory module 100, such as a USB flash drive. Memory module 100 includes one or more memory devices 102 that may be disposed on a printed circuit board 103 for one embodiment. A housing 105, formed in accordance with the disclosed embodiments, encloses memory device 102 and circuit board 103. Memory device 102 may be fabricated as a semiconductor device on a semiconductor substrate, which in turn may be disposed on circuit board 103. Examples of memory devices include NAND, NOR, or NROM flash memory devices, dynamic random access memory devices (DRAMs), static random access memory devices (SRAMs), or the like.

For one embodiment, memory device 102 includes an array of memory cells 104, e.g., flash memory cells, an address decoder 106, row access circuitry 108, column access circuitry 110, control circuitry 112 coupled to memory array 104 for controlling operations of memory array 104, Input/Output (I/O) circuitry 114, and an address buffer 116. Memory device 102 may be coupled an external host device 132 by electrical contacts 134 disposed at an end 135 of circuit board 103 and by electrical contacts 136 of host device 132. For example, for one embodiment, contacts 134 might be in the form of a male connector, such as a USB Type-A male connector, and contacts 136 might be in the form of a female connector, such as a USB Type-A female connector. Examples of host devices include digital cameras, digital recording and playback devices, PDAs, personal computers, memory card readers, interface hubs, or the like.

For one embodiment, memory device 102 may be coupled to a light source 140, such as a light emitting diode (LED), that may be mounted adjacent an end 141 of circuit board 103 that is opposite end 135 of circuit board 103, as shown in FIG. 1. For some embodiments, light source 140 indicates operation of memory device 102, such as access of memory array 104.

Memory device 102 receives control signals from host device 132 over a control link 142. The memory cells are used to store data that are accessed via a data (DQ) link 144. Address signals are received via an address link 146 that are decoded at address decoder 106 to access the memory array 104. Address buffer circuit 116 latches the address signals. The memory cells are accessed in response to the control signals and the address signals. Note that control link 142, data (DQ) link 144, and address link 146 are formed when contacts 144 of memory module 100 are electrically connected to contacts 136 of host device 132. It will be appreciated by those skilled in the art that additional circuitry and control signals can be provided, and that the memory module of FIG. 1 has been simplified to help focus on the invention.

Figure 2:
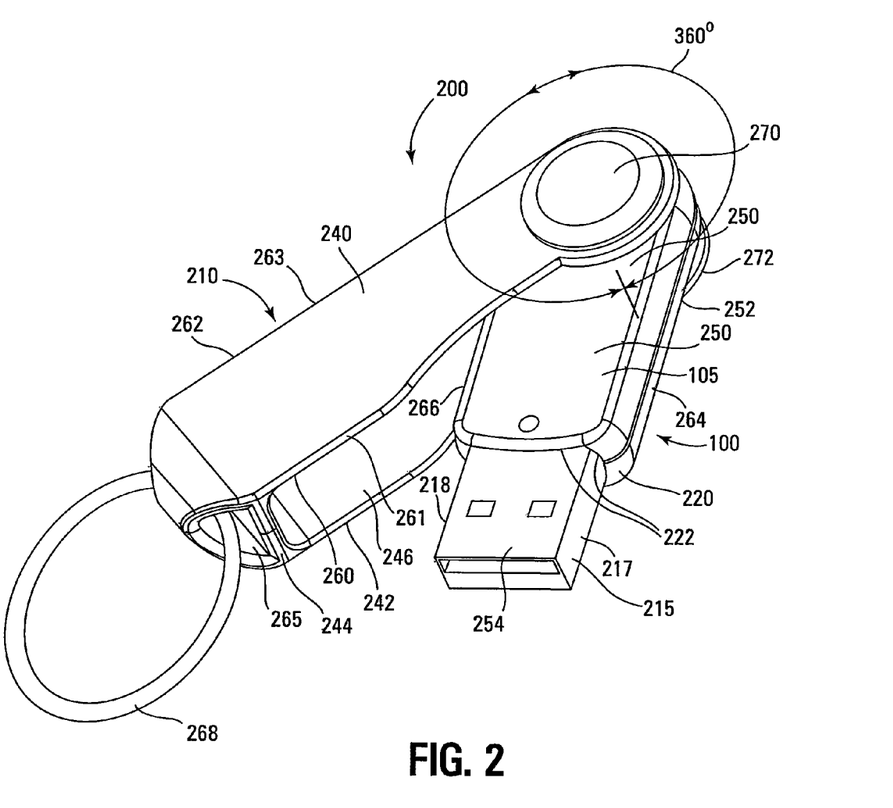
FIG. 2 is a top perspective view of an embodiment of a storage device, according to another embodiment of the disclosure.

FIG. 2 is a top perspective view of a storage device 200, e.g., a portable storage device, according to another embodiment. Storage device 200 includes a memory module, such as memory module 100 (FIG. 1), and a cover (e.g., cap) 210 pivotally coupled to housing 105 of memory module 100. For one embodiment, memory module 100 can be pivoted by 360 degrees in either the clockwise or counterclockwise directions with respect to cover 210, as shown in FIG. 2.

For one embodiment, a male connector 215, e.g., a USB Type-A male connector, corresponding to contacts 144 of FIG. 1, extends from an end 220 of housing 105, as shown in FIG. 2, and is electrically connected to memory device 102 (not shown), e.g., using electrical traces (not shown) formed in circuit board 103. Specifically, connector 215 extends through an opening 222 in end 220 of housing 105, as shown in FIG. 2. For one embodiment, housing 105 may be formed from plastic and male connector 215 is an electrical conductor, such as metal. Cover 210 may be formed from plastic or metal, for example. Cover 210 may be formed by, e.g., die casting or injection molding.

Figure 3:
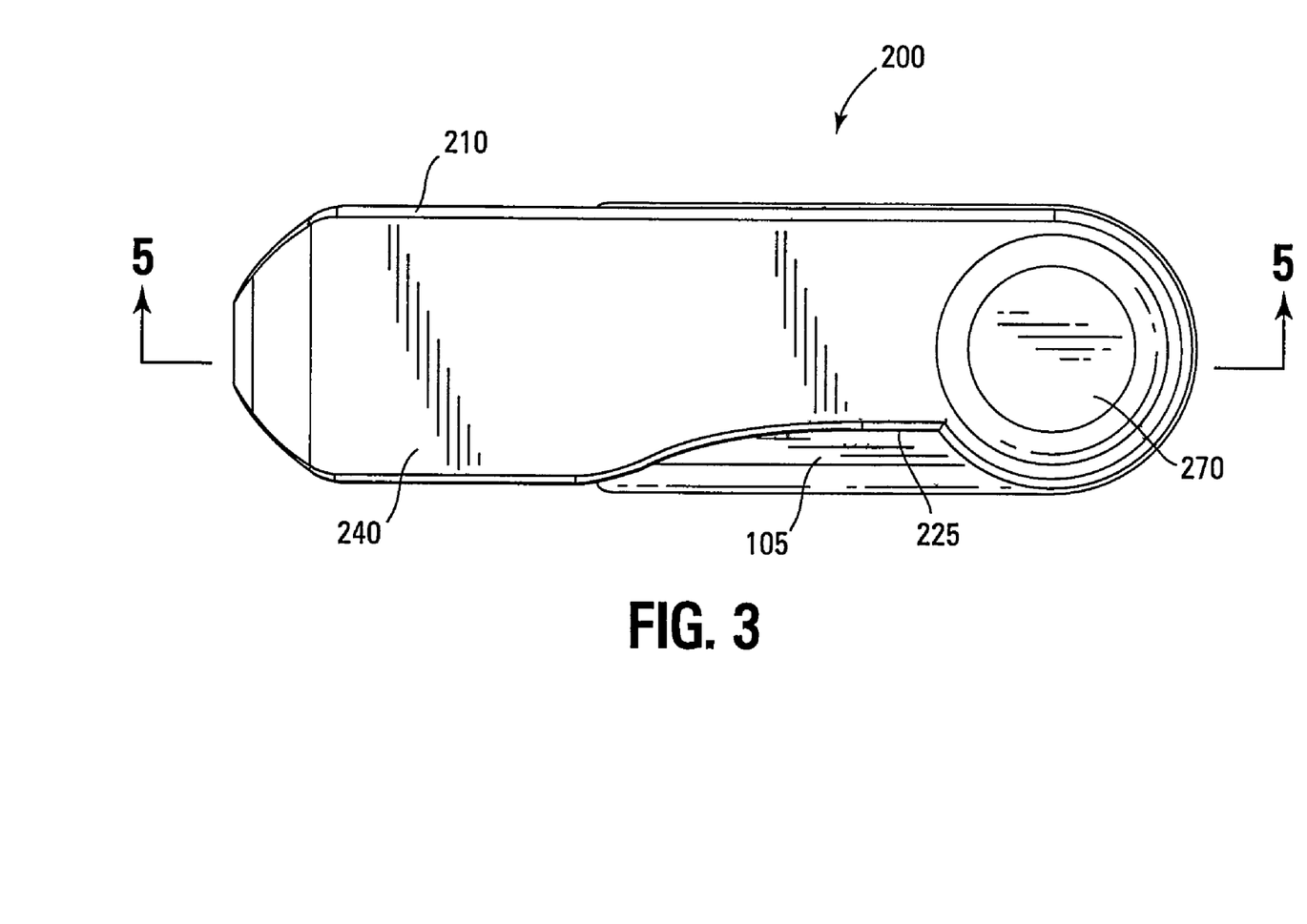
FIG. 3 is a top view of an embodiment of a storage device, according to another embodiment of the disclosure.
Figure 4:
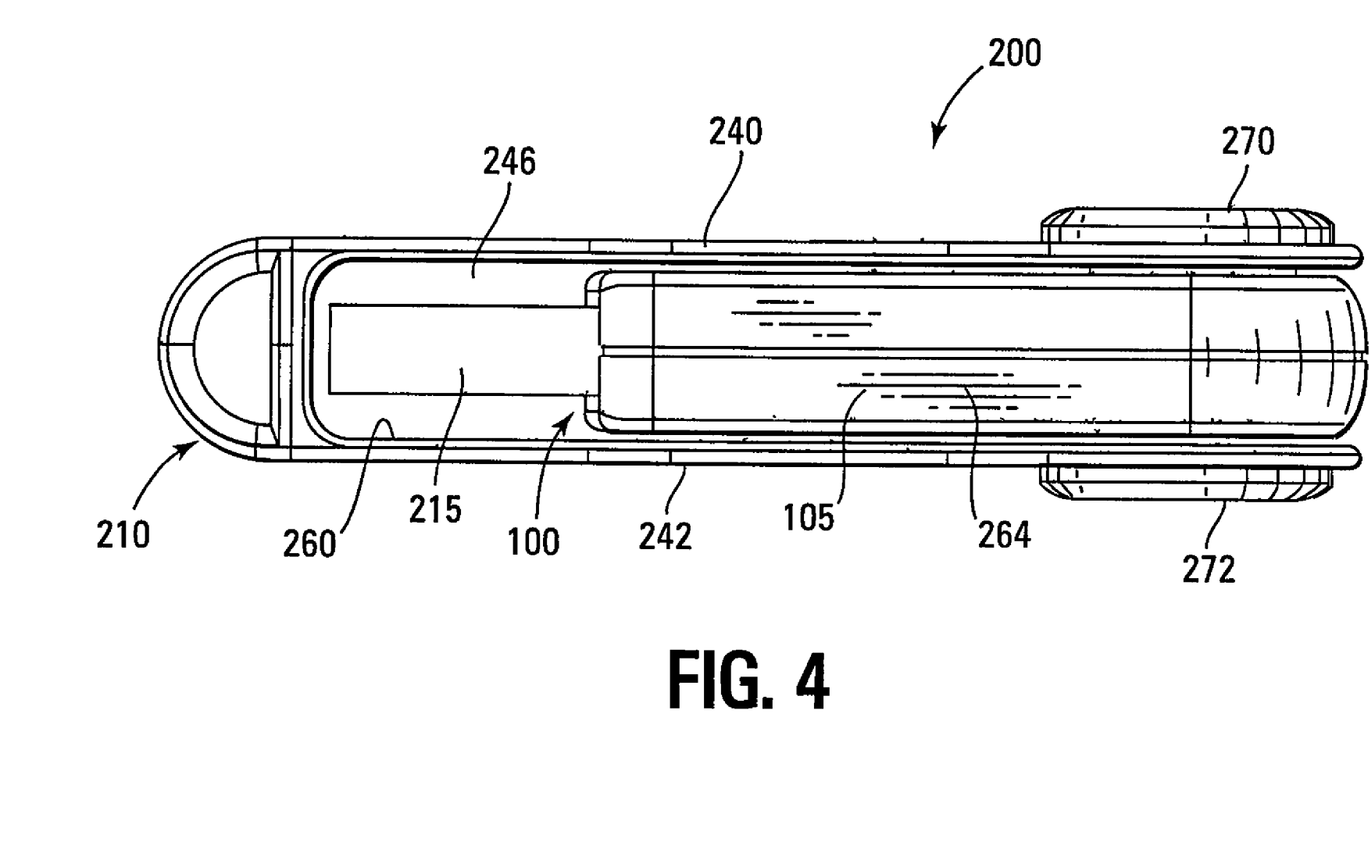
FIG. 4 is a front view of an embodiment of a storage device, according to another embodiment of the disclosure.

FIGS. 3 and 4 are respectively top and front views of storage device 200 in a non-operational configuration, where memory module 100 is not being used, but is being stored or transported, and where memory module 100 and/or cover 210 have been pivoted so that cover 210 encloses at least a portion of connector 215 and at least a portion of an exterior surface of housing 105. For one embodiment, the bottom of storage device 200 may be a mirror image of the top.

Figure 7:
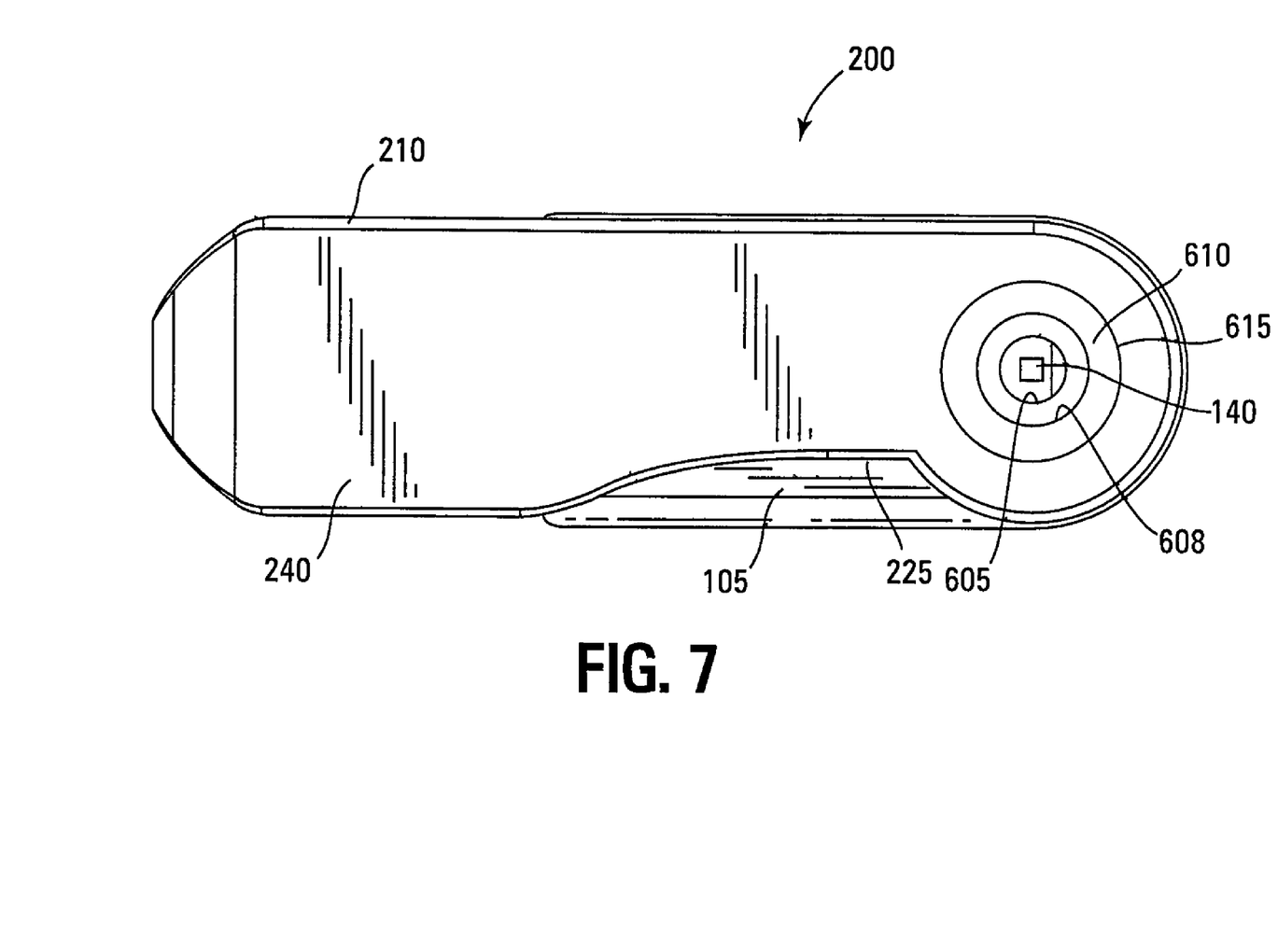
FIG. 7 is a top view of an embodiment of a storage device in a non-operational configuration with a light-pipe removed, according to another embodiment of the disclosure.
Figure 8:
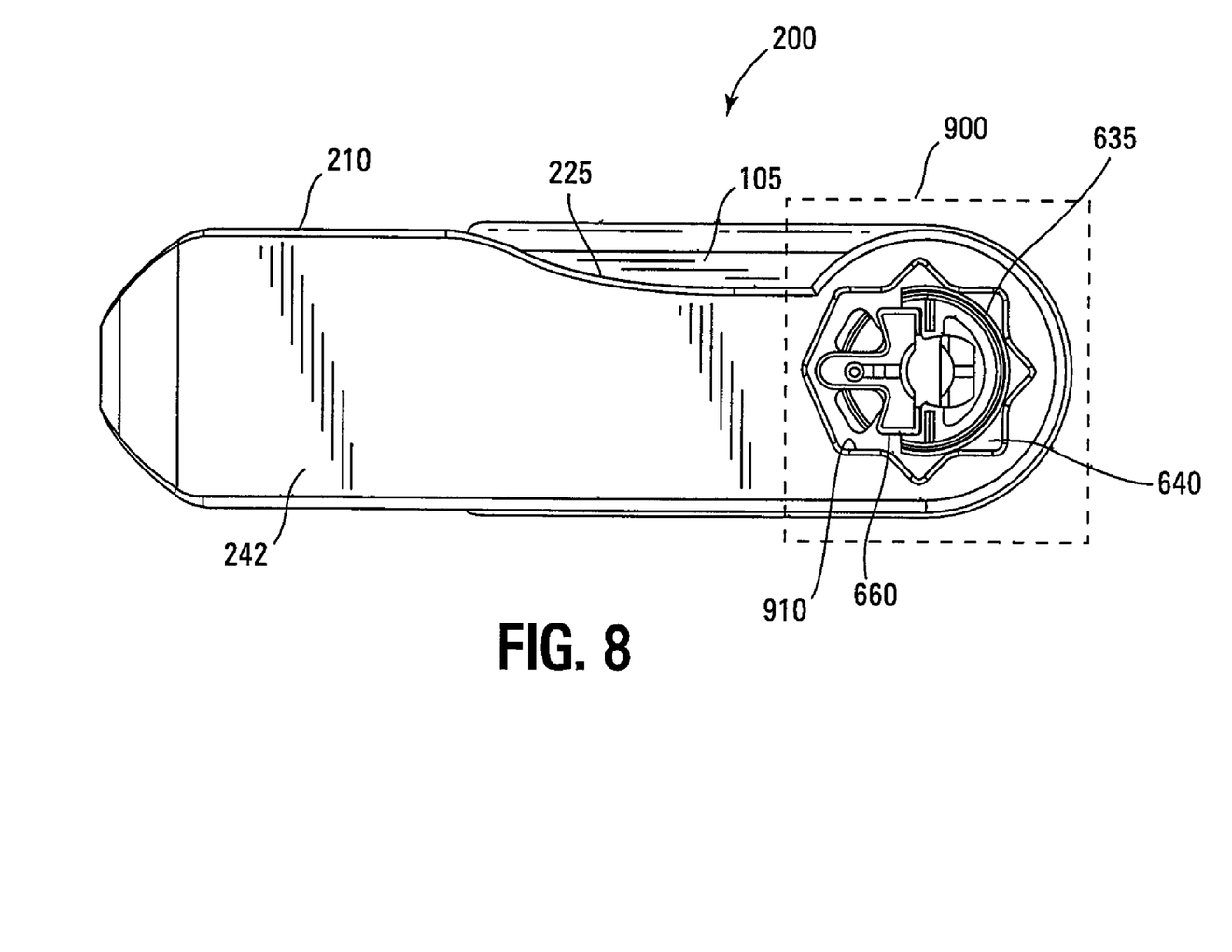
FIG. 8 is a bottom view of an embodiment of a storage device in a non-operational configuration with a light-pipe removed, according to another embodiment of the disclosure.

A notch 225 may be formed in the top and bottom of cover 210, as shown for the top of cover 210 in FIGS. 3 and 7 and the bottom of cover 210 in FIG. 8, for exposing portions of the top and bottom exterior surfaces of housing 105 when storage device 200 is in its non-operational configuration. Notches 225 facilitate grasping housing 105, at the exposed top and bottom exterior surfaces of housing 105, for pivoting memory module from the non-operational configuration of FIG. 3 to an operational configuration, where connector 215 is fully exposed.

Figure 5:
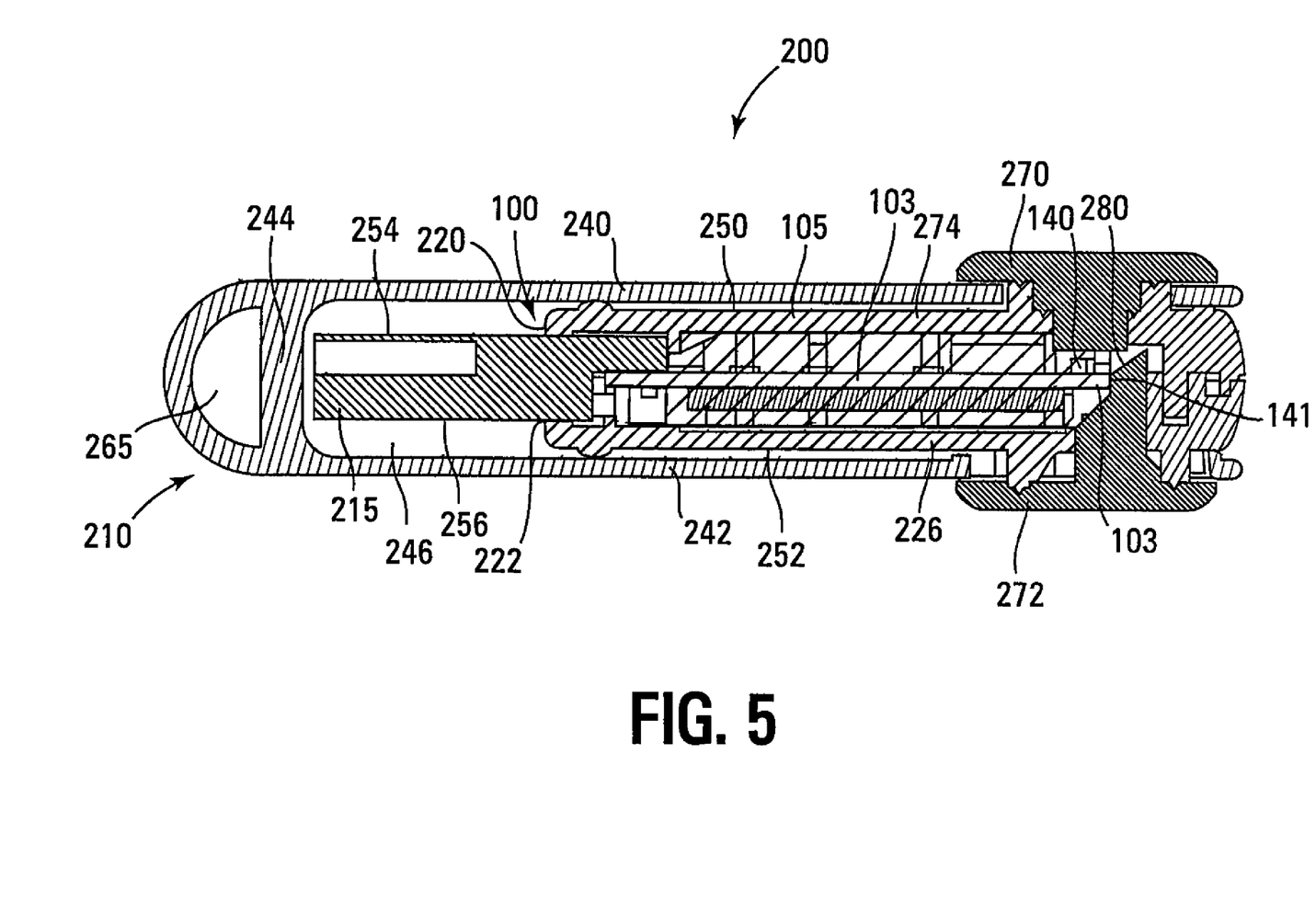
FIG. 5 is a cross-sectional view taken along the line 5-5 of FIG. 3, according to another embodiment of the disclosure.

FIG. 5 is a cross-sectional view taken along the line 5-5 of FIG. 3, according to another embodiment. FIG. 5 shows housing 105 enclosing the circuit board 103 and connector 215 connected to circuit board 103 and extending through the opening 222 in end 220 of housing 105. For one embodiment, light source 140 may be surface mounted on circuit board 103 adjacent end 141 of circuit board 103 that is opposite connector 215, as shown in FIG. 5.

As best seen in FIGS. 2 and 5, cover 210 includes tines 240 and 242 extending from an end 244 of cover 210. For one embodiment, tines 240 and 242 and end 244 respectively form top, bottom, and end walls of cover 210 and define an interior 246 of cover 210 having a substantially U-shaped cross-section, as shown in FIG. 5. A portion of housing 105 of memory module 100 is pivotally connected to the ends of tines 240 and 242 opposite base 244.

When storage device 200 is in its non-operational configuration, a top exterior surface 250 and a bottom exterior surface 252 of housing 105 as well as a top exterior surface 254 and a bottom exterior surface 256 of connector 215 are substantially enclosed within interior 246, as shown in FIG. 5. Specifically, when storage device 200 is in its non-operational configuration, tine 240 of cover 210 overlies at least a portion of top exterior surface 250 of housing 105 and overlies top surface 254 of connector 215, and tine 242 of cover 210 overlies at least a portion of bottom exterior surface 252 of housing 105 and overlies bottom surface 256 of connector 215, as shown in FIG. 5. Note that the notches 225 formed in the front and back of cover 210, as discussed above, are respectively formed in tines 240 and 242, as shown in FIGS. 3, 7, and 8, and thereby respectively expose corresponding portions of top exterior surface 250 of housing 105 and bottom exterior surface 252 of housing 105.

For one embodiment, opposing openings 260 and 262 are respectively formed in the front 261 and back 263 of cover 210 between tines 240 and 242, as shown in FIG. 2. This means that cover 210 is open at its front and back so that memory module 100 can be pivoted by 360 degrees in either the clockwise or counterclockwise directions. That is, memory module 100 can be pivoted into and out of interior 246 through either opening 260 or opening 262. Note that when storage device 200 is in its non-operational configuration, openings 260 and 262 respectively expose a front surface 264 and back surface 266 (FIG. 2) of housing 105, as shown in FIG. 4 for opening 260 and front surface 264. Moreover, openings 260 and 262 respectively expose a front surface 217 and back surface 218 (FIG. 2) of connector 215 when storage device 200 is in its non-operational configuration.

For one embodiment, a hole 265 passes through end 244 of cover 210, as shown in FIGS. 2 and 5, e.g., in a direction substantially perpendicular to the front 261 and back 263 of cover 210. A lanyard 268, such as a keychain, cord, strap, or the like, may be looped through hole 265, as shown in FIG. 2.

Figure 6:
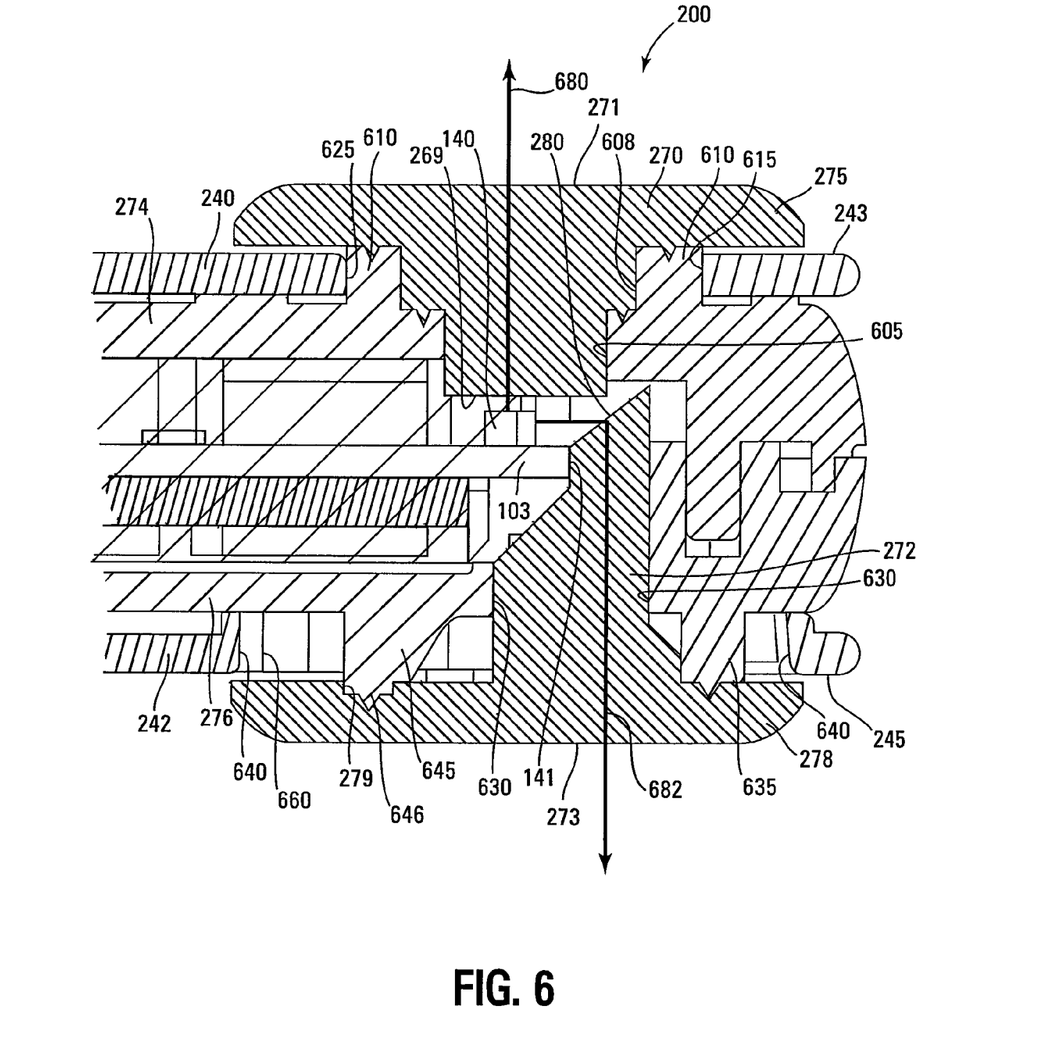
FIG. 6 is a cross-sectional view of a portion of an embodiment of a storage device during operation, according to another embodiment of the disclosure.

For one embodiment, light transmission elements, such as light-pipes 270 and 272, respectively pass through tines 240 and 242 and through top wall 274 and bottom wall 276 of housing 105 and extend into the interior of housing 105, as shown in FIGS. 5 and 6. FIG. 6 is an enlarged cross-sectional view of a portion of storage device 200 when storage device 200 is in an operational configuration and is coupled to a host device by connector 215 and light source 140 is illuminated.

Light-pipe 270 is optically coupled to light source 140. For example, light-pipe 270 can face the surface of circuit board 103 on which light source 140 is mounted, and thus light-pipe 270 faces light source 140, as shown in FIG. 6. For one embodiment, light-pipe 270 directly overlies, e.g., lies directly vertically above, an upper portion of light source 140, as shown in FIG. 6. Note that light-pipe 270 optically couples light source 140 to the exterior surroundings of storage device 200.

FIG. 7 is a top view of storage device 200 in its non-operational configuration with light-pipe 270 removed, according to another embodiment. For one embodiment, a hole 605 passes through top wall 274 of housing 105 and opens into the interior of housing 105, as shown in FIGS. 6 and 7. Note that hole 605 aligns with and exposes light source 140. A bore 608 that passes partially through wall 274 can be used to countersink hole 605, as shown in FIGS. 6 and 7.

For one embodiment, a circular rib 610 extends from top wall 274 of housing 105 and passes through a hole 615 that passes through tine 240 of cover 210, as shown in FIGS. 6 and 7. For another embodiment, rib 610 extends past an exterior surface 243 of tine 240, as shown in FIG. 6. For one embodiment, rib 610 is formed around bore 608. Circular rib 610 can rotate within hole 615 and thus pivotally couples housing 105 to tine 240.

Light-pipe 270 passes through countersunk hole 605 and extends into the interior of housing 105 so that light-pipe 270 is aligned with light source 130, as shown in FIG. 6. For one embodiment, a head (e.g., flared portion) 275 of light-pipe 270 abuts rib 610 so that head 275 extends over (e.g., overlies) a portion of exterior surface 243 of tine 240. Head 275 can also be separated from exterior surface 243 of tine 240, as shown in FIG. 6. Light-pipe 270 may be, for example, welded to top wall 274 within countersunk hole 605 and to rib 610, e.g., by ultrasonic welding, or may be press fitted in countersunk hole 605. Light-pipe 270 can thus rotate with housing 105 relative to cover 210 when memory module 100 is pivoted. That is, light-pipe 270 and housing 105 form an integral rotatable body that can rotate relative to cover 210.

For one embodiment, light-pipe 272 has a beveled surface 280 that extends past (e.g., above in terms of FIG. 6) the surface of circuit board 103 on which light source 140 is mounted, as shown in FIG. 6. As illustrated in FIG. 6, surface 280 can be located adjacent light source 140 and adjacent of end 141 of circuit board 103 in a direction away from connector 215, as shown in FIGS. 5 and 6. For one embodiment, surface 280 forms about a 45-degree angle with respect to the surface of circuit board 103 on which light source 140 is mounted, e.g., about a 45-degree angle with respect to the horizontal in terms of FIG. 6. Surface 280 optically couples light source 140 to portions of light-pipe 272 that are located exteriorly of tine 242 and thus optically couples light source 140 to the exterior surroundings of storage device 200.

Figure 9:
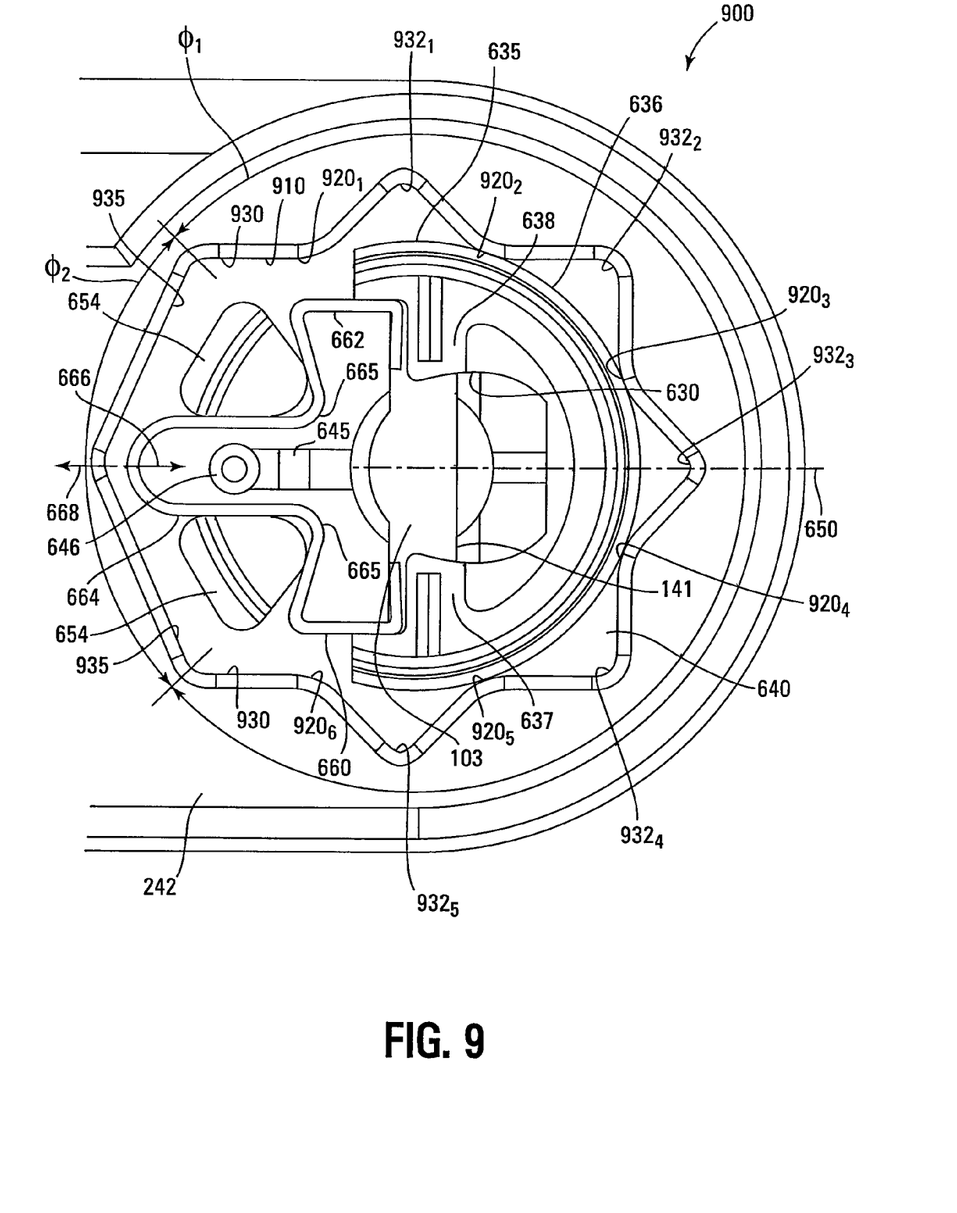
FIG. 9 is an enlarged view of the region 900 of FIG. 8, according to another embodiment of the disclosure.

FIG. 8 is a bottom view of storage device 200 in its non-operational configuration with light-pipe 272 removed, according to another embodiment. FIG. 9 is an enlarged view of the region 900 of FIG. 8. For one embodiment, a hole 630 passes through bottom wall 276 of housing 105 and opens into the interior of housing 105, as shown in FIGS. 6 and 9. Hole 630 aligns with and exposes end 141 of circuit board 103 and a portion of a surface of circuit board 103 that faces opposite to the surface of circuit board 103 on which light source 140 is mounted, as shown in FIGS. 6 and 9.

For one embodiment, a rib 635 extends from bottom wall 276 of housing 105 and passes through a hole 640 that passes through tine 242 of cover 210, as shown in FIGS. 6, 8, and 9. In one embodiment, rib 635 extends past an exterior surface 245 of tine 242, as shown in FIG. 6. Rib 635 can partially surrounds hole 630. Rib 635 can rotate within hole 640 and thus pivotally couples housing 105 to tine 242. For one embodiment, hole 640 is defined by a serrated (e.g., toothed) interior surface 910 of tine 242, as shown in FIGS. 8 and 9.

For one embodiment, rib 635 includes a rounded portion 636. Rounded portion 636 can have the shape of a partial circle (e.g., arc) with angular extent greater than the angular extent of a semicircle, e.g., greater than about 180 degrees, as shown in FIG. 9. For one embodiment, rib 635 includes opposing radial portions 637 and 638 that extend radially inward from rounded portion 636 in opposite directions. For another embodiment, radial portions 637 and 638 are about 180 degrees apart along rounded portion 636.

A protrusion 645 extends from bottom wall 276 of housing 105 and passes through hole 640, as shown in FIGS. 6 and 9. For another embodiment, protrusion 645 extends past exterior surface 245 of tine 240, as shown in FIG. 6. For one embodiment, protrusion 645 is centered on a line 650 that coincides with a diameter of rounded portion 636 of rib 635, as shown in FIG. 9. For another embodiment, a pair of lugs 654 extends from bottom wall 276 so that a lug 654 is located on either side of protrusion 645, as shown in FIG. 9.

For one embodiment, a spring 660 (FIGS. 8 and 9) is disposed on bottom wall 276 so that a portion of spring 660 is retained between lugs 654 and radial portions 637 and 638 of rib 635 and another portion extends between lugs 654, as shown in FIG. 9. In particular, for another embodiment, spring 660 may be substantially T-shaped, where the cross portion 662 of the "T" is retained between lugs 654 and radial portions 637 and 638 of rib 635 and the stem portion 664 of the "T" extends between lugs 654, as shown in FIG. 9.

For one embodiment, spring 660 is in its neutral position or state in FIG. 9. Moving stem 664 relative to lugs 654 in the direction of arrow 666 while cross portion 662 is retained between lugs 654 and radial portions 637 and 638 of rib 635 compresses spring 660 into a compressed state. Moving stem 664 in the direction of arrow 668 stretches spring 660 into a stretched state.

Light-pipe 272 passes through hole 630 and extends into the interior of housing 105 so that beveled surface 280 of light-pipe 272 extends above the surface of circuit board 103 on which light source 140 is mounted and beveled surface 280 is located laterally of end 141 of circuit board 103 in a direction away from connector 215, as shown in FIGS. 5 and 6. For one embodiment, a head 278 of light-pipe 270 abuts rib 635 so that head 278 extends over (or overlies) a portion of exterior surface 245 of tine 242, as shown in FIG. 6. For another embodiment, head 278 is separated from exterior surface 245 of tine 242, as shown in FIG. 6. For one embodiment, a pin (or stud) 646, extending from protrusion 645 (FIGS. 6 and 9), extends into a blind hole 279 formed in head 278 of light-pipe 242, as shown in FIG. 6. Head 278 of light-pipe 272 may cover spring 660. That is, spring 660 may be located between head 278 and bottom wall 276 of housing 105, as shown in FIG. 6.

For another embodiment, light-pipe 272 may be welded to bottom wall 276 within hole 630, to rib 635, and to pin 646, e.g., by ultrasonic welding. Therefore, light-pipe 272 rotates with housing 105 relative to cover 210 when memory module 100 is pivoted. That is, light-pipe 272 and housing 105 form an integral rotatable body that can rotate relative to cover 210. For one embodiment, light-pipe 272 may be press fitted into hole 630. For another embodiment, light-pipes 270 and 272 may be connected to housing 105, as shown in FIG. 6, and subsequently ultra-sonically welded to housing 105 substantially simultaneously. Therefore, for another embodiment, light-pipes 270 and 272 and housing 105 form an integral rotatable body that can rotate relative to cover 210.

When light source 140 is lighted, light is emitted from the top and side of light source 140, as shown in FIG. 6. Light emitted from the top of light source 140 is captured by light-pipe 270, e.g., at a substantially flat surface 269 directly overlying light source 140, passes through light-pipe 270, and is transmitted through an exterior surface 271 of light-pipe 270, as illustrated by a light ray 680, for one embodiment.

An exterior surface 273 of light-pipe 272 faces away from the surface of circuit board 103 of which light source 140 is mounted. That is, exterior surface 273 of light-pipe 272 is not visible to the surface of circuit board 103 on which light source 140 is mounted. Surface 280 optically couples light source 140 to exterior surface 273 and enables exterior surface 273 to be illuminated by light source 140. Specifically, light emitted from the side of light source 140 is captured by inclined surface 280 of light-pipe 272 and is reflected by substantially 90 degrees by inclined surface 280, as illustrated by a light ray 682, for one embodiment. The light reflected by inclined surface 280 passes through light-pipe 272 from inclined surface 244 to exterior surface 273 of light-pipe 272 and is transmitted through exterior surface 273.

Exterior surfaces 271 and 273 respectively of light-pipes 270 and 272 face in opposite directions. The configuration of light-pipes 270 and 272 enables the opposing exterior surfaces 271 and 273 to be illuminated by a single surface-mounted light source. This means that housing 105 is backward compatible with existing memory-module circuit board configurations that typically use a single surface-mounted light source. In alternative embodiments, a second light source may be mounted on the surface of circuit board 103 that faces opposite the surface on which light source 140 is mounted, and similar to light-pipe 270, light-pipe 272 may have a substantially flat surface directly underlying the second light source for capturing light from the second light source.

In FIG. 9, it is seen that for one embodiment, teeth 920 of serrated interior surface 910 of tine 242 may be regularly spaced over a first portion 930 of interior surface 910 that spans an angular distance $\phi_1$, e.g., of about 270 degrees. Teeth 920 project inwardly toward the interior of hole 640 and are separated from each other by inter-tooth regions (e.g., valleys) 932. A portion of the teeth 920 engage rounded portion 636 of rib 635 in the configuration of FIGS. 8 and 9.

For another embodiment, there are no teeth on a second portion 935 of interior surface 910 that spans an angular distance $\phi_2$, e.g., of about 90 degrees. The second portion 935 of serrated interior surface 910 may be viewed as an inter-tooth region having a larger angular extent than inter-tooth regions 932 and disposed between a first tooth of teeth 920, e.g., tooth $920_1$, and a last tooth of teeth 920, e.g., tooth $920_6$. For one embodiment, the angular extent of inter-tooth region 935 is about twice that of inter-tooth regions 932.

In the non-operational configuration of storage device 200, shown in FIGS. 8 and 9, the stem portion 664 of spring 660 is substantially centered within inter-tooth region 935 and thus between teeth $920_1$ and $920_6$. For one embodiment, stem 664 may be separated from serrated interior surface 910 within inter-tooth region 935, as shown in FIG. 9, so that spring 660 is in its neutral (or non-displaced) state when its stem portion 664 is within inter-tooth region 935.

Figure 10:
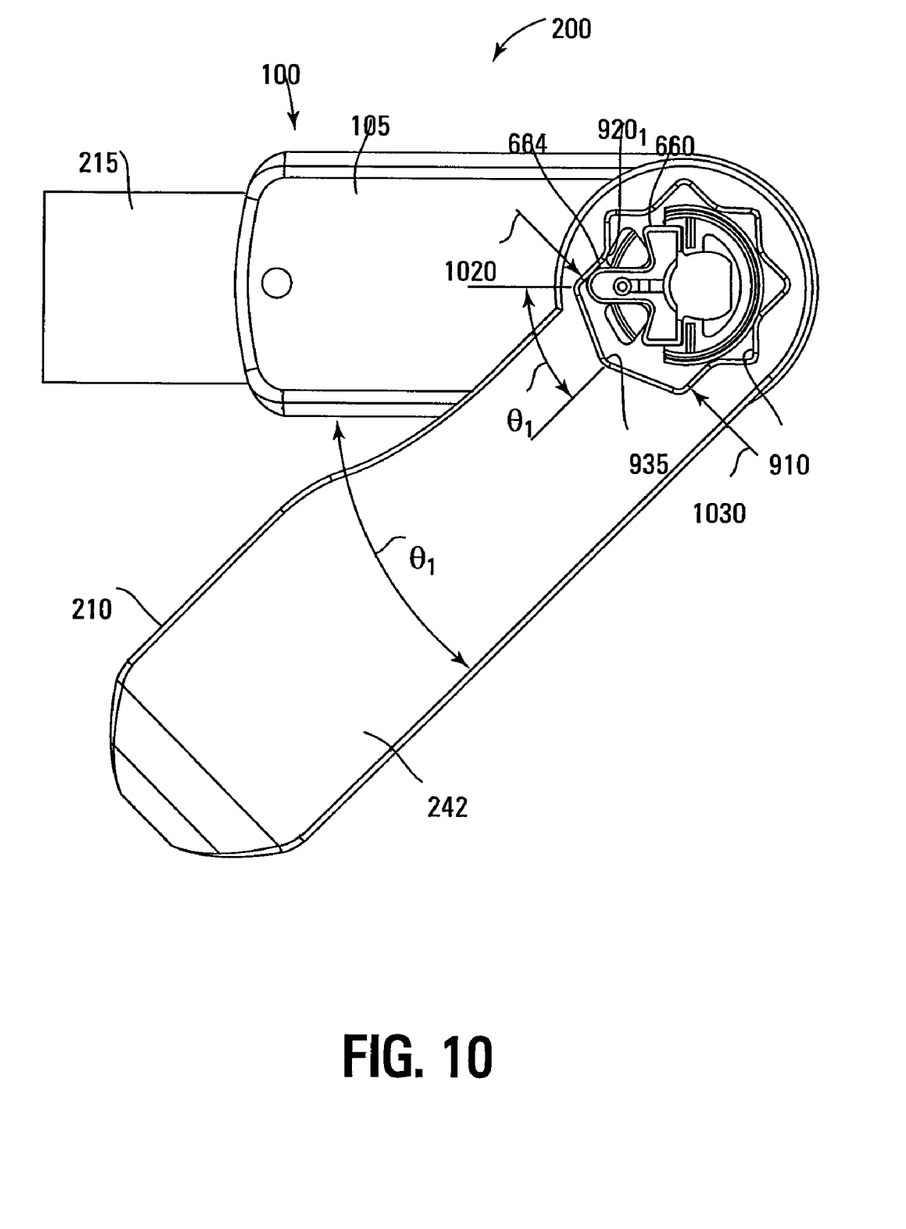
FIG. 10 is a bottom view of an embodiment of a storage device with a light-pipe removed and pivoted by an angular distance from a non-operational configuration, according to another embodiment of the disclosure.

FIG. 10 illustrates storage device 200 after cover 210 is pivoted, e.g., in the counterclockwise direction, from its position in FIGS. 8 and 9, corresponding to the non-operational configuration of storage device 200, by an angular distance $\theta_1$, e.g., of about 45 degrees. For one embodiment, as cover 210 is pivoted from the non-operational configuration to the position of FIG. 10, spring 660 remains in its neutral state, and stem 664 of spring 660 does not engage interior surface 910 until cover 210 reaches the position of FIG. 10, where stem 664 just engages interior surface 910 at the location indicated by arrow 1020. For some embodiments, spring 660 remains in its neutral state and stem 664 of spring 660 does not engage interior surface 910 when stem 664 is located within inter-tooth region 935 (FIG. 9) between where the location of interior surface 910 indicated by arrow 1030 just engages stem 664 to where the location of interior surface 910 indicated by arrow 1020 just engages stem 664, as shown in FIG. 10. That is, spring 660 remains in its neutral state and stem 664 of spring 660 does not engage interior surface 910 when stem 664 is located within inter-tooth region 935 as interior surface 910 is moving with respect to spring 660 or as spring 660 is moving with respect to interior surface 910.

This facilitates reconfiguring storage device 200 from its non-operational configuration to its operational configuration, by moving cover 210 and housing 105 with respect to each other, in that any friction that would otherwise occur between stem 664 and interior surface 910 within inter-tooth region 935 if stem 664 was biased in contact interior surface 910 is virtually eliminated. That is, if stem 664 was biased in contact with interior surface 910 within inter-tooth region 935, the resulting friction between stem 664 and interior surface 910 would make it difficult to initially move housing 105 and cover 210 relative to each other when storage device 200 is in its non-operational configuration. For some embodiments, however, while spring 660 remains in its neutral state, stem 664 may engage portions of interior surface 910 within inter-tooth region 935, as interior surface 910 moves between the locations indicated by arrows 1020 and 1030 or as stem 664 moves between the locations indicated by arrows 1020 and 1030.

Note that cover 210 and memory module 100 can move relatively freely when stem 664 is located within inter-tooth region 935. However, additional force, such as applied by a user, is required to move cover 210 and memory module 100 with respect to each other so as to move stem 664 past the locations indicated by arrows 1020 and 1030. This acts to effectively retain storage device 200 in the configurations corresponding to when stem 664 is located within inter-tooth region 935.

Figure 11:
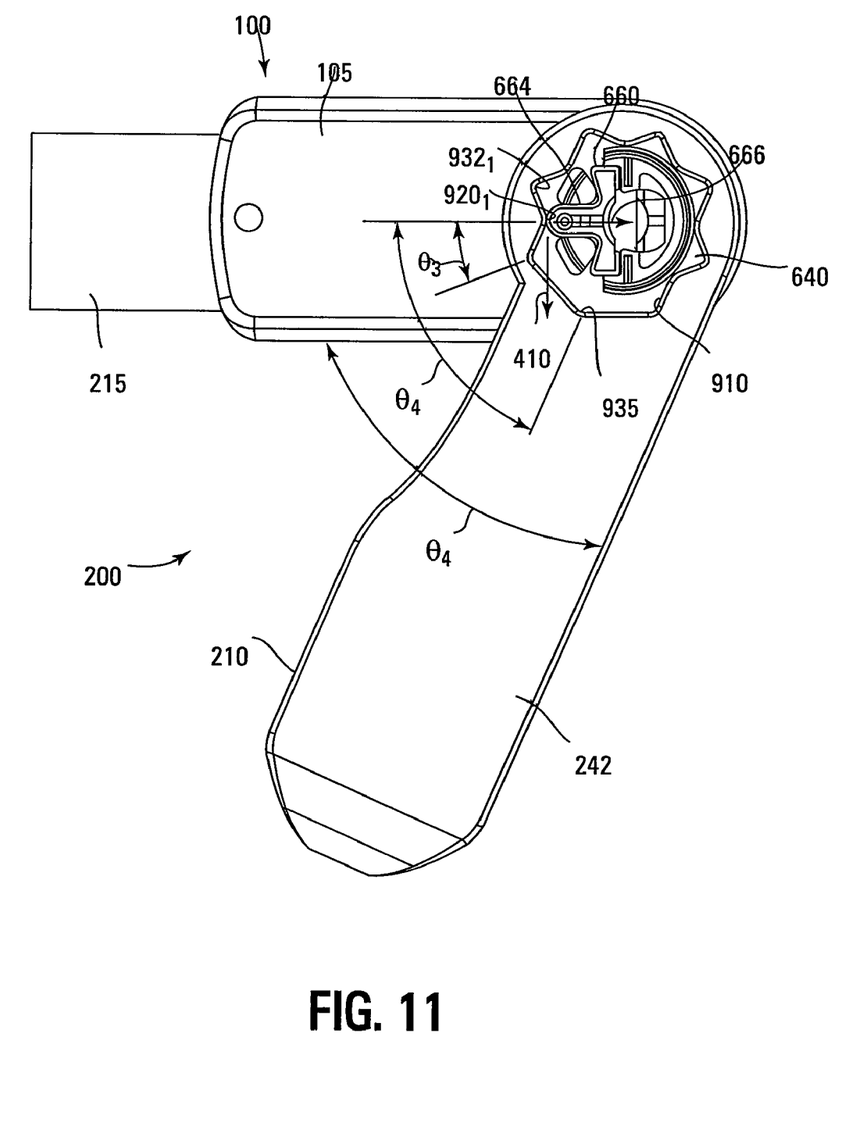
FIG. 11 is a bottom view of an embodiment of a storage device with a light-pipe removed and pivoted by another angular distance from a non-operational configuration, according to another embodiment of the disclosure.

FIG. 11 illustrates storage device 200 after cover 210 is pivoted from its position in FIG. 10, where spring 660 is its neutral state, by an angular distance $\theta_3$, e.g., in the counterclockwise direction. That is, after cover 210 is pivoted by an angular distance $\theta_4$, e.g., of about 68 degrees, from its position of FIGS. 8 and 9, corresponding to the non-operational configuration of storage device 200. As cover 210 is pivoted, interior surface 910 moves over the angular distance $\theta_3$ from where the location of interior surface 910 indicated by arrow 1020 just engages stem 664 (FIG. 10) to a location where stem 664 is aligned with the peak of tooth $920_1$. For one embodiment, stem 664 is substantially centered with respect to the peak of tooth $920_1$, as shown in FIG. 11.

As interior surface 910 moves over the angular distance $\theta_3$, interior surface 910 remains in contact with stem 664, and interior surface 910 deflects stem 664 in the direction of arrow 666 toward the interior of hole 640, e.g., substantially perpendicular to the angular direction, from the neutral state of spring 660, occurring where the location of interior surface 910 indicated by arrow 1020 just engages stem 664 (FIG. 10), until stem is substantially centered with respect to the peak of tooth $920_1$. That is, interior surface 910 compresses spring 660 from its neutral state as the peak of tooth $920_1$ moves toward stem 664. In other words, spring 660 is compressed between interior surface 910 and radial portions 637 and 638 of rib 635 (FIG. 9).

Stem 664 moves in the direction of arrow 666 and compresses spring 660 until stem is substantially centered with respect to the peak of tooth $920_1$. This biases stem 664 against tooth $920_1$. That is, stem 664 is biased against interior 910 as interior surface 910 moves over the angular distance $\theta_3$.

Figure 12:
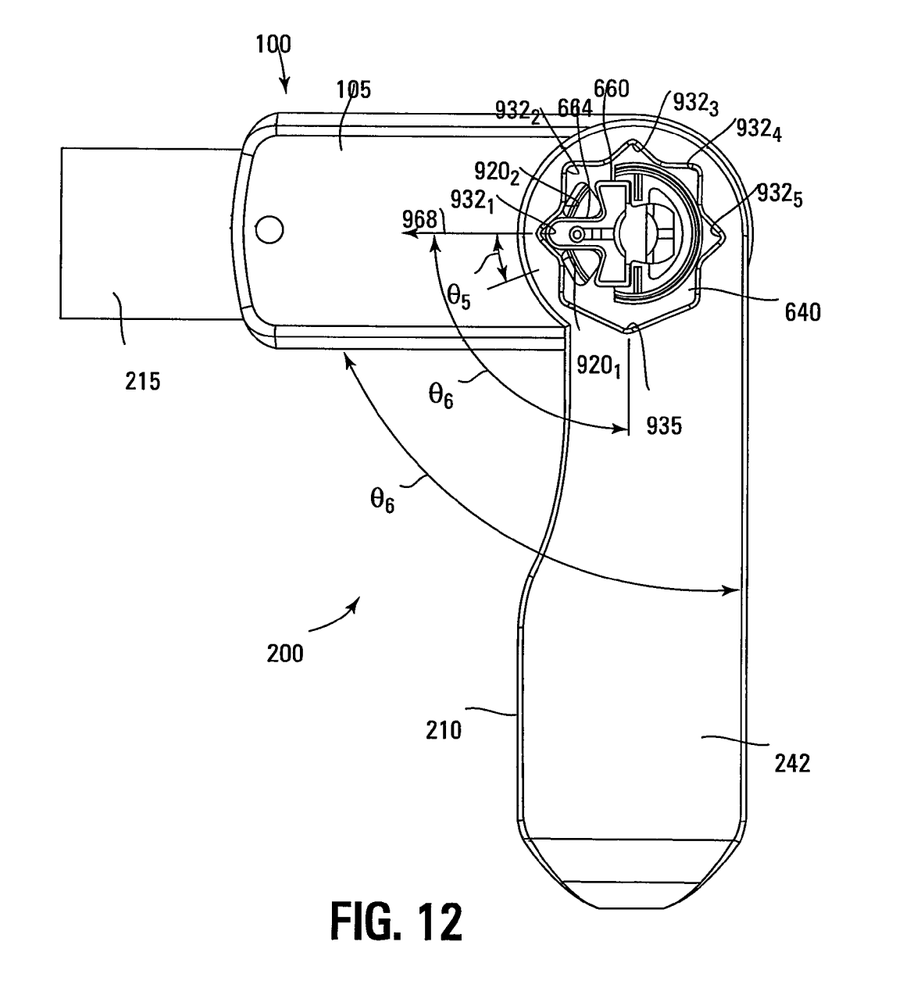
FIG. 12 is a bottom view of an embodiment of a storage device with a light-pipe removed and pivoted from a non-operational configuration to an operational configuration, according to another embodiment of the disclosure.

FIG. 12 illustrates storage device 200 after cover 210 is pivoted from its position in FIG. 11 by an angular distance $\theta_5$, e.g., in the counterclockwise direction. That is, after cover 210 is pivoted by an angular distance $\theta_6$, e.g., of about 90 degrees, from its position of FIGS. 8 and 9, corresponding to the non-operational configuration of storage device 200. As cover 210 is pivoted, interior surface 910 moves over the angular distance $\theta_5$ from where stem 664 is aligned with the peak of tooth $920_1$ (FIG. 11) to the where stem 664 is located within inter-tooth region $932_1$. For one embodiment, stem 664 is substantially centered within a lowermost portion inter-tooth region $932_1$, as shown in FIG. 12.

As interior surface 910 moves over the angular distance $\theta_5$, interior surface 910 remains in contact with stem 664, and stem 664 is biased against interior surface 910. This means that stem 664 is biased within inter-tooth region $932_1$. Note that as the lowermost portion inter-tooth region $932_1$ moves toward stem 664, with stem 664 biased against interior surface 910, stem 664 moves in the direction of arrow 968 toward the exterior of hole 640, e.g., substantially perpendicular to the angular direction, decompressing spring 660 somewhat. However, stem 664 remains biased against interior surface 910.

For one embodiment, stem 664 remains biased against the first portion 930 of interior surface 910 (FIG. 9) as interior surface moves with respect to stem 664 or stem 664 moves with respect to interior surface 910. For example, when cover 210 is moving counterclockwise, as shown in FIGS. 10-12, stem 664 remains biased against the first portion 930 of interior surface 910 from where the location of interior surface 910 indicated by arrow 1020 just engages stem 664 (FIG. 10) to where the location of interior surface 910 indicated by arrow 1030 just disengages stem 664 (FIG. 10).

Biasing stem 664 within inter-tooth region $932_1$, as shown in FIG. 12, retains (e.g., temporarily locks) storage device 200 in the configuration of FIG. 12 and acts to reduce the likelihood of cover 210 and memory module 100 from be unintentionally moved with respect to each other. Note that for one embodiment, the configuration of FIG. 12 corresponds to a discrete operational configuration of storage device 200, where memory module 100 and/or cover 210 have been pivoted to expose connector 215 so that connector 215 can be inserted into a female connector, such as a USB Type-A female connector, of a host device to connect memory module 100 to the host device.

For one embodiment, when stem 664 is respectively located within inter-teeth regions $932_1$ to $932_6$ storage device 200 is respectively configured in different discrete operational configurations. Note that spring 660 biases stem 664 in each of the inter-teeth regions thus retaining storage device 200 in each of its discrete operational configurations. For another embodiment, successive inter-teeth regions 932 are located at angular distances of about 45 degrees from each other, and thus inter-teeth regions $932_1$, $932_2$, $932_3$, $932_4$, $932_5$, and $932_6$ are respectively correspond to operational configurations of storage device 200 where cover 210 and memory module are pivoted with respect to each other from the non-operational configuration of FIGS. 8 and 9 by about 90 (FIG. 12), 135, 180, 225, and 270 degrees.

Pivoting cover 210, e.g., in the counterclockwise direction, from the configuration of FIG. 12 so that stem is biased within inter-tooth region $932_2$ configures storage device 200 at another of the discrete operational configurations of storage device 200. As cover 210 pivots from the configuration of FIG. 12, interior surface 910 moves stem 664 of spring 660 toward the interior of hole 640, i.e., in the direction of arrow 666 (FIG. 11), until the peak of tooth $920_2$ aligns stem 664.

After the peak of tooth $920_2$ starts to move past stem 664, stem 664 moves toward the exterior of hole 640, i.e., in the direction of arrow 968 (FIG. 12), until stem 664 is biased within inter-tooth region $932_2$.

As cover 210 pivots, while stem is in contact with the first portion 930 of interior surface 910 (FIG. 9), stem 664 moves toward the interior of hole 640 as interior surface 910 moves from a location where stem 664 is biased in an inter-tooth region 932 to a location where the peak of the successively adjacent tooth 920 aligns with stem 664, and stem 664 moves toward the exterior of hole 640 as interior surface 910 moves from a location where stem 664 is aligned with a peak of a tooth 920 to a location where stem is biased within the successively adjacent inter-tooth region 932. Viewed another way, stem 664 moves toward the interior of hole 640 as stem 664 moves from an inter-tooth region 932 to the peak of the successively adjacent tooth 920, and stem 664 moves toward the exterior of hole 640 as stem 664 moves from a location where stem 664 is aligned with a peak of a tooth 920 to a location where stem is biased within the successively adjacent inter-tooth region 932.

Pivoting housing 105 and cover 210 with respect to each other when stem 664 is biased against the first portion 930 (FIG. 9) of interior surface 910 produces a force component 1110 on stem 664 that acts to move the end of stem 664 in contact with interior surface 910 in a direction of motion of cover 210, as shown in FIG. 11. That is, force component 1110 acts to move the end of stem 664 in contact with interior surface 910 in a direction substantially perpendicular to direction of motion of stem 664, indicated by arrow 666 (FIG. 11), as spring 660 is being compressed. Force component 1110 is induced by friction between stem 664 and interior surface 910. The biasing force of spring 660 may also contribute to force component 1110, e.g., when interior surface 910 moves against the curved side portion of stem 664 adjacent the tip of stem 664, as shown in FIG. 10, so that the biasing force is in the direction of arrow 1020. Force component 1110 acts to produce stress concentration where stem 664 connects to cross portion 662 of spring 660 that can cause spring 660 to fail.

As best seen in FIG. 9 spring 660 includes radiuses 665 that are connected between stem 664 and cross portion 662 of spring 660. Radiuses 665 act to reduce stress concentration that can occur in this region of spring 660 due to force component 1110 and thereby act to reduce the likelihood of failure of spring 660.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:
1. A storage device comprising:
a memory module comprising a light source; and
a cover having light-transmission elements extending from opposing exterior surfaces of the cover,
wherein in a configuration of the memory module and the cover, the light transmission-elements are optically coupled to the light source.

2. The storage device of claim 1, wherein the storage device and the cover are configured to retain the storage device in the configuration of the memory module and the cover.

3. The storage device of claim 2, wherein the storage device is retained in the configuration of the memory module by a spring.

4. The storage device of claim 1, wherein in the configuration of the memory module and the cover, the light-transmission elements optically couple the light source to exterior surroundings of the storage device.

5. The storage device of claim 1, wherein an exterior surface of one of the light-transmission elements is not visible to a surface of a circuit board of the memory module on which the light source is mounted.

6. The storage device of claim 1, wherein each of the light-transmission elements comprises a head portion, wherein the head portions of the light-transmission elements respectively extend over portions of the opposing exterior surfaces of the cover.

7. The storage device of claim 1, wherein the cover comprises a pair of tines extending from an end of the cover.

8. The storage device of claim 7, wherein the pair of tines and the end define an interior of the cover having a substantially U-shaped cross-section.

9. The storage device of claim 1, wherein a hole passes though a portion of the cover for receiving a lanyard therethrough.

10. The storage device of claim 1, wherein when the light-transmission elements are optically coupled to the light source, the light-transmission elements pass though a housing of the memory module that encloses the light source.

11. The storage device of claim 10, wherein when the light-transmission elements are connected to the housing of the memory module.

12. A storage device, comprising:
a memory module comprising a connector and a light source;
a cover; and
opposing light-pipes that respectively overlie opposing exterior surfaces of the cover;
wherein in a configuration of the storage device, the cover is in a first position and substantially encloses the connector of the memory module;
wherein in an other configuration of the storage device, the cover is in a second position and the connector of the memory module the connector is entirely exposed; and
wherein the light transmitting elements are optically coupled to the light source when the cover is in the second position and the connector of the memory module the connector is entirely exposed.

13. The storage device of claim 12, wherein the storage device and the cover are configured to retain the cover in at least one of the first and second positions.

14. The storage device of claim 12, wherein a portion of one of the light-pipes directly overlies the light source.

15. The storage device of claim 14, wherein an other one of the light-transmission elements comprises a beveled surface located adjacent the light source, and an exterior surface of the other one of the light-transmission elements overlying one of the opposing exterior surfaces of the cover is not visible to a surface of the circuit board on which the light source is mounted.

16. A storage device, comprising:
a memory module comprising a light source and a connector;
a cover comprising opposing exterior surfaces; and
opposing light-transmission elements that respectively extend from the opposing exterior surfaces of the cover;
wherein in a configuration of the cover and the memory module, the connector is covered by the cover; and
wherein in an other configuration of the cover and the memory module, the connector is entirely exposed and the opposing light-transmission elements are optically coupled to the light source.

17. The storage device of claim 16, wherein one of the light-transmission elements comprises a beveled surface located adjacent the light source and an exterior surface that is not visible to a surface of the circuit board on which the light source is mounted, the inclined surface optically coupling the light source to that light-transmission element.

18. The storage device of claim 17, wherein the beveled surface forms about a 45-degree angle with respect to the surface of circuit board on which the light source is mounted.

19. The storage device of claim 16, wherein the storage device can be retained at at least one of the configurations by a spring.

20. The storage device of claim 16, wherein each of the light-transmission elements comprises a head portion, wherein the head portions of the light-transmission elements respectively overlie the opposing exterior surfaces of the cover.

* * * * *

UNITED STATES PATENT AND TRADEMARK OFFICE
CERTIFICATE OF CORRECTION

PATENT NO. : 7,815,464 B2  Page 1 of 1
APPLICATION NO. : 12/710705
DATED : October 19, 2010
INVENTOR(S) : Hyekyung Kim

It is certified that error appears in the above-identified patent and that said Letters Patent is hereby corrected as shown below:

In column 11, line 26, in Claim 9, delete "though" and insert -- through --, therefor.

In column 11, line 30, in Claim 10, delete "though" and insert -- through --, therefor.

Signed and Sealed this

Fourteenth Day of December, 2010

David J. Kappos
*Director of the United States Patent and Trademark Office*